(12) United States Patent
Tanaka

(10) Patent No.: US 12,038,653 B2
(45) Date of Patent: Jul. 16, 2024

(54) DISPLAY DEVICE

(71) Applicant: Japan Display Inc., Tokyo (JP)

(72) Inventor: Hitoshi Tanaka, Tokyo (JP)

(73) Assignee: Japan Display Inc., Tokyo (JP)

(*) Notice: Subject to any disclaimer, the term of this patent is extended or adjusted under 35 U.S.C. 154(b) by 466 days.

(21) Appl. No.: 17/305,403

(22) Filed: Jul. 7, 2021

(65) Prior Publication Data

US 2021/0333651 A1 Oct. 28, 2021

Related U.S. Application Data

(63) Continuation of application No. PCT/JP2019/048124, filed on Dec. 9, 2019.

(30) Foreign Application Priority Data

Jan. 8, 2019 (JP) .................................. 2019-001266

(51) Int. Cl.
*H01L 27/12* (2006.01)
*G02F 1/1343* (2006.01)
(Continued)

(52) U.S. Cl.
CPC .. *G02F 1/134309* (2013.01); *G02F 1/136227* (2013.01); *G02F 1/1368* (2013.01);
(Continued)

(58) Field of Classification Search
CPC ......... G02F 1/134309; G02F 1/136227; G02F 1/1368; G02F 1/136286; H01L 27/1225; H01L 27/1214–1296; H01L 29/7869–78693; H01L 21/76895; H01L 23/481; G09F 9/30; H10K 59/12–1315; H10K 59/80–95; H10K 59/10–221; H05K 2201/10136
See application file for complete search history.

(56) References Cited

U.S. PATENT DOCUMENTS

2016/0204180 A1 7/2016 Lee et al.
2017/0025444 A1 1/2017 Hirakata
(Continued)

FOREIGN PATENT DOCUMENTS

JP 2010-039810 A 2/2010

OTHER PUBLICATIONS

Office Action issued on Aug. 22, 2023, in corresponding Japanese Application No. 2022-170776, 8 pages.

*Primary Examiner* — Shahed Ahmed
(74) *Attorney, Agent, or Firm* — Maier & Maier, PLLC

(57) ABSTRACT

According to one embodiment, a display device includes a first inorganic insulating film covering an oxide semiconductor layer and a protective metal layer, a second inorganic insulating film covering a gate electrode, a first connection electrode in contact with the protective metal layer at a first opening portion which penetrates through the first inorganic insulating film and the second inorganic insulating film, a first organic insulating film covering the first connection electrode, and a second connection electrode in contact with the first connection electrode at a second opening portion which penetrates through the first organic insulating film, wherein the second opening portion is located above the first opening portion.

15 Claims, 7 Drawing Sheets

(51) Int. Cl.
   *G02F 1/1362*    (2006.01)
   *G02F 1/1368*    (2006.01)
   *H01L 29/417*    (2006.01)

(52) U.S. Cl.
   CPC ...... *H01L 27/1225* (2013.01); *H01L 27/1248* (2013.01); *H01L 29/41733* (2013.01)

(56) References Cited

U.S. PATENT DOCUMENTS

2018/0083084 A1   3/2018  Kim et al.
2020/0105843 A1*  4/2020  Baek .................... H10K 50/813
2021/0043873 A1*  2/2021  Sung .................... H10K 50/115

* cited by examiner

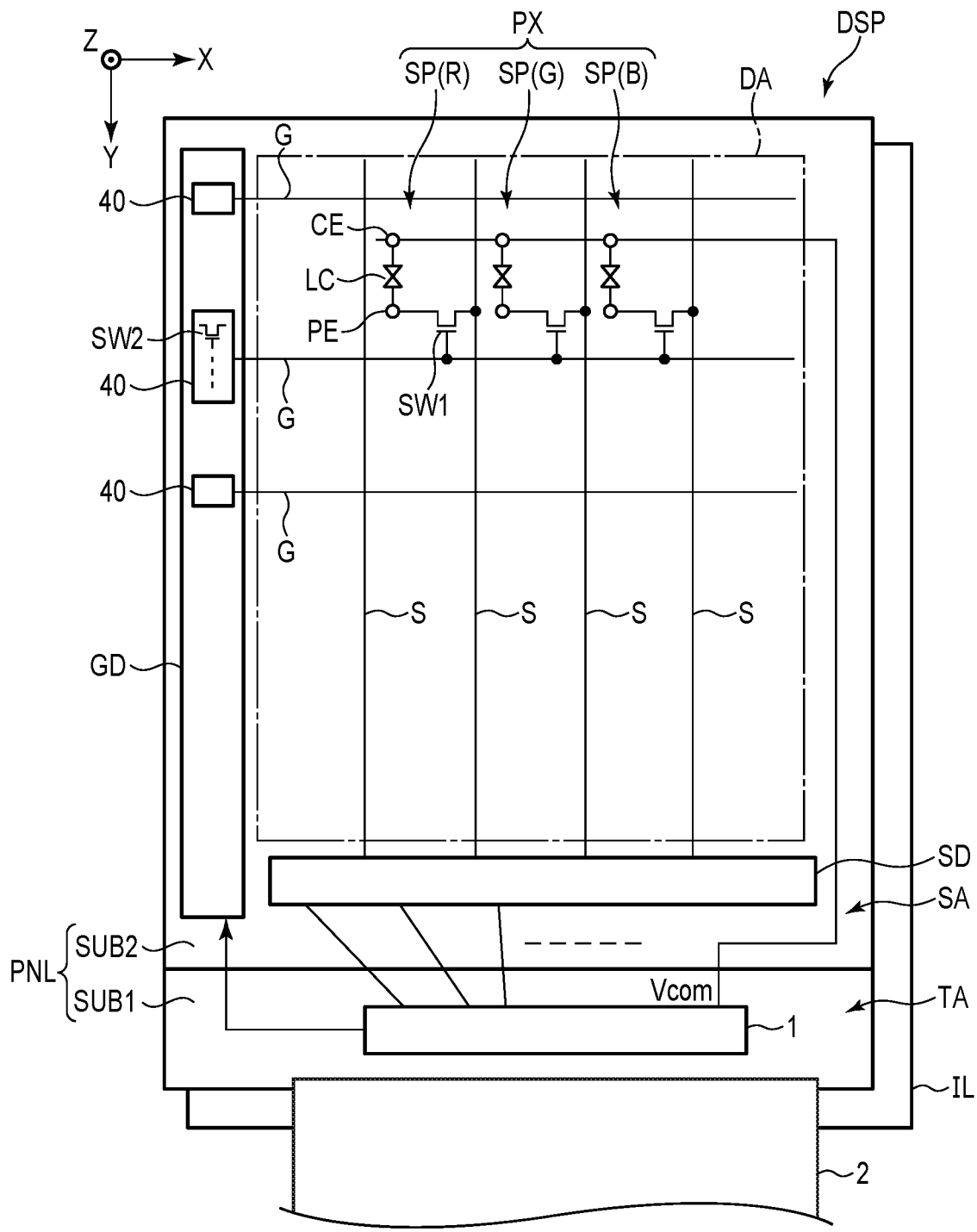
F I G. 1

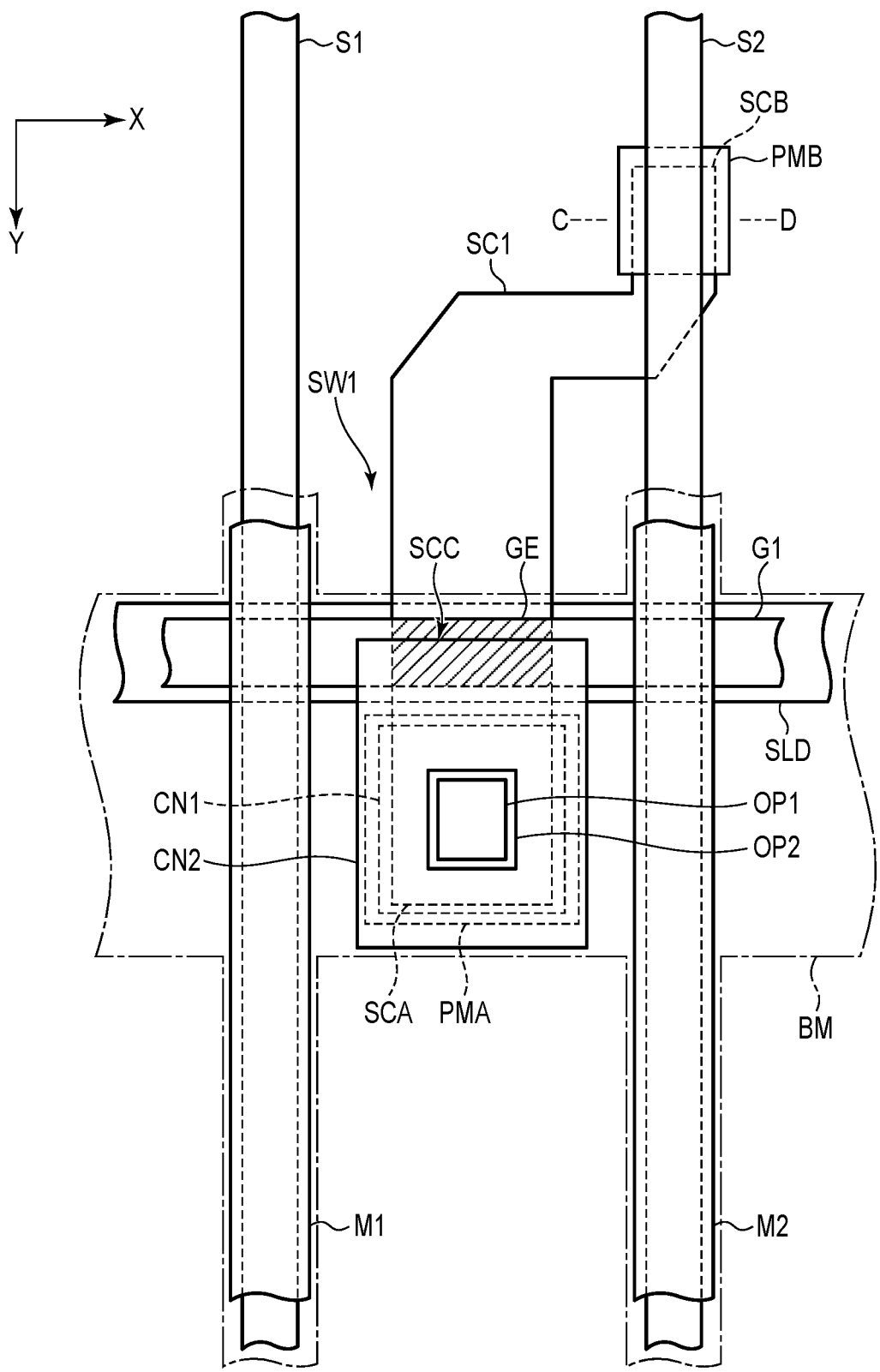
F I G. 2

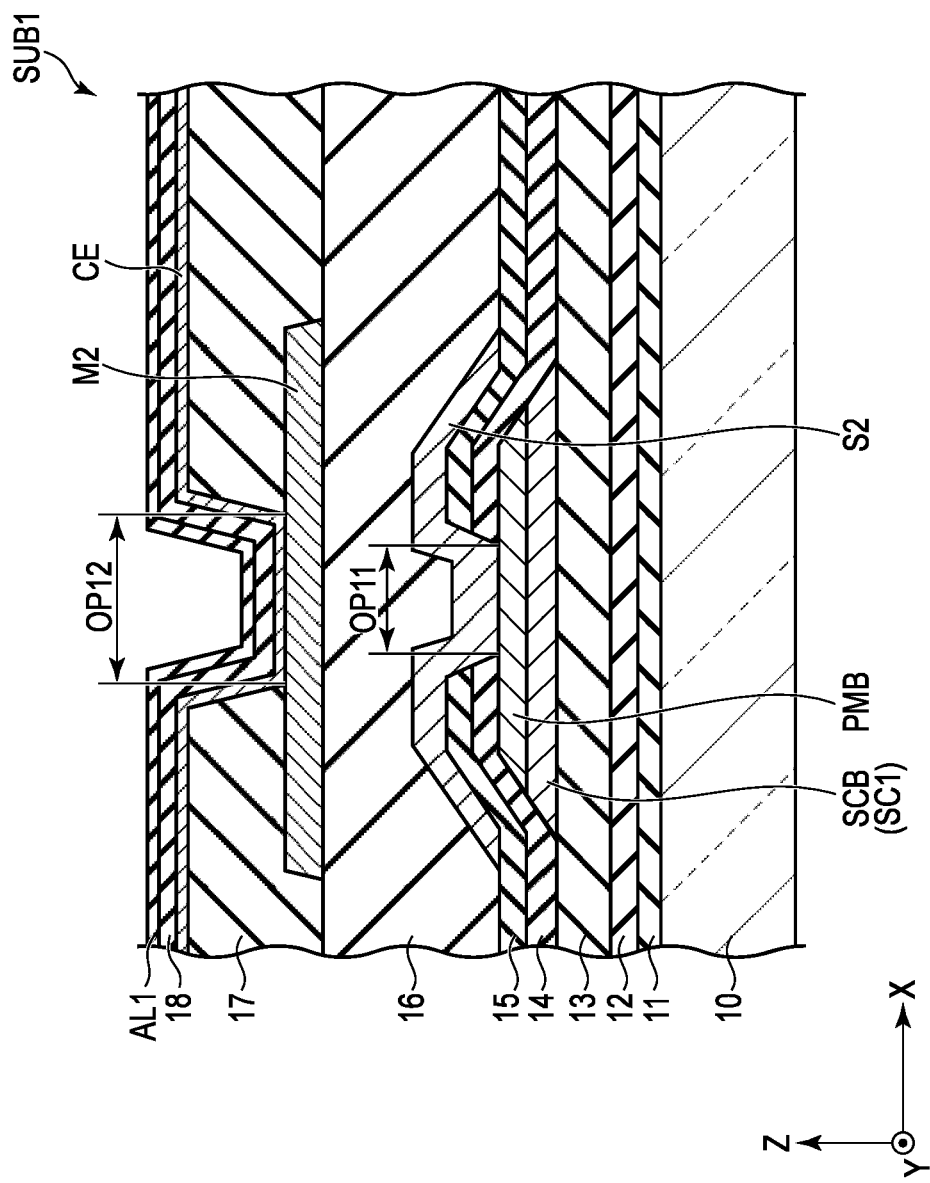
F I G. 5

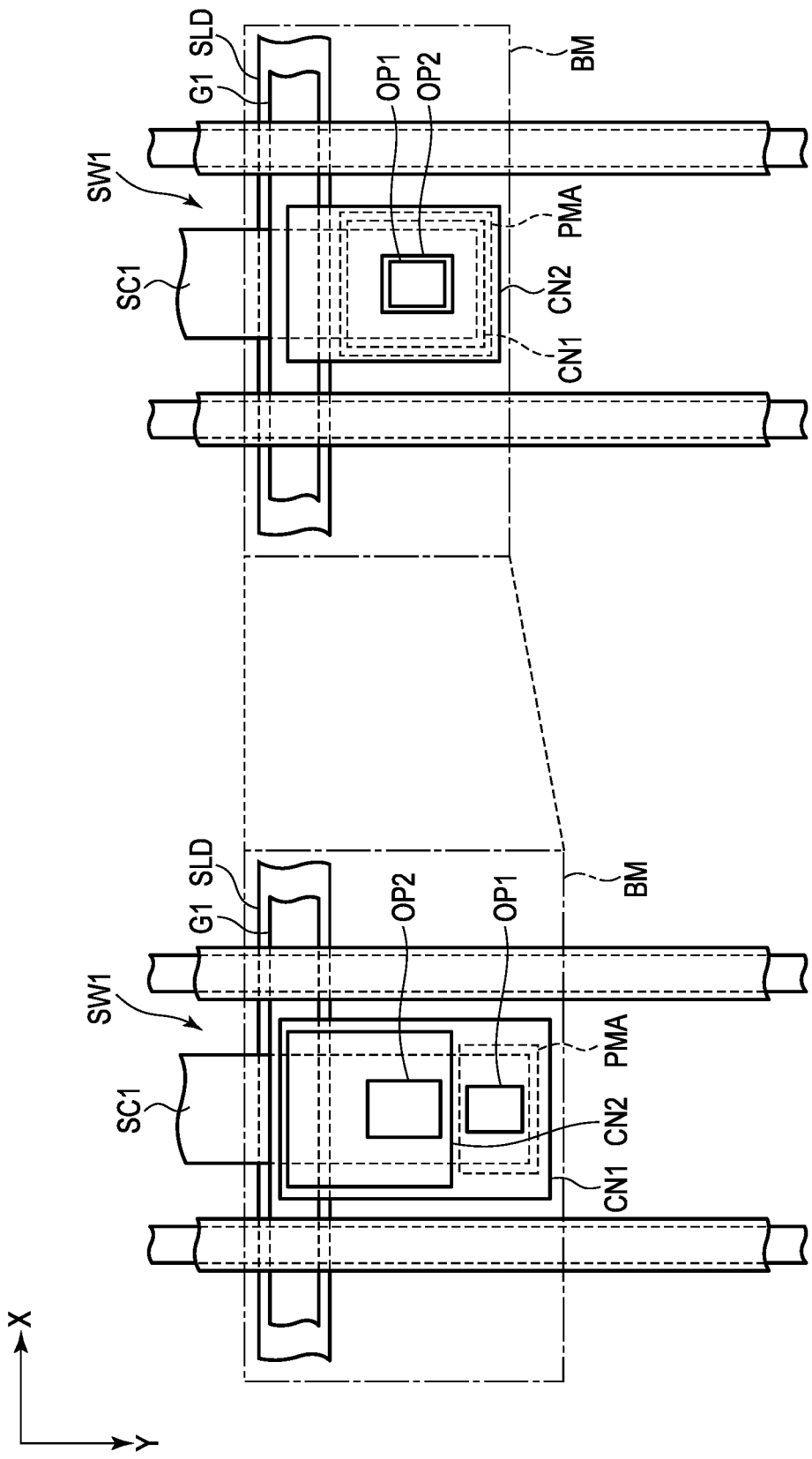
F I G. 6

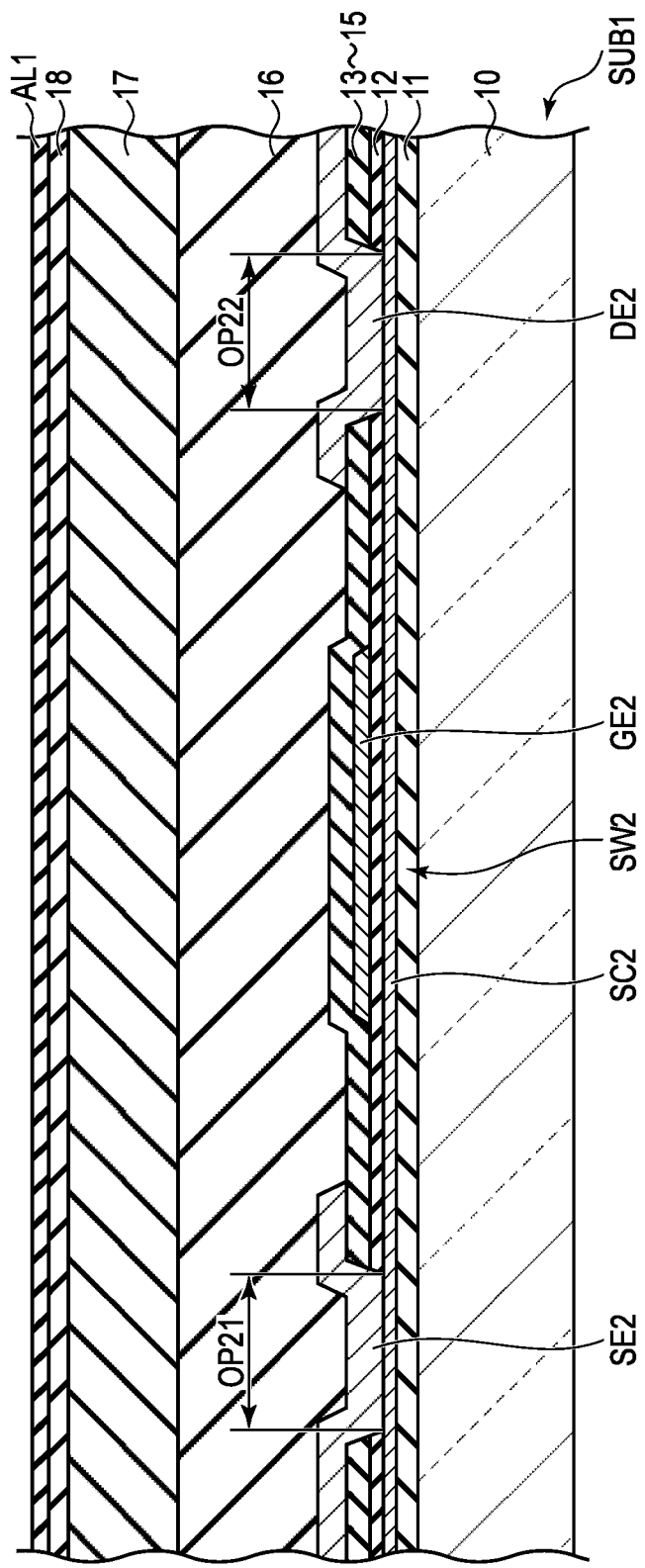
F I G. 7

DISPLAY DEVICE

CROSS-REFERENCE TO RELATED APPLICATIONS

This application is a Continuation Application of PCT Application No. PCT/JP2019/048124, filed Dec. 9, 2019 and based upon and claiming the benefit of priority from Japanese Patent Application No. 2019-001266, filed Jan. 8, 2019, the entire contents of all of which are incorporated herein by reference.

FIELD

Embodiments described herein relate generally to a display device.

BACKGROUND

In a display device such as a liquid crystal display device, a technology of combining a first switching element comprising an oxide semiconductor layer and a second switching element comprising a polycrystalline silicon semiconductor layer has been proposed. For example, the first switching element is provided at each pixel, and the second switching element is provided at a peripheral circuit.

Requirement for higher definition has been increased in the display devices of recent years, and while the size of one pixel is reduced, the number of wiring lines tends to be increased. Accordingly, in each of the pixels, due to reduction of an opening portion which contributes to display, lowering of brightness may be caused. In order to compensate for such lowering of brightness, if brightness of an illumination device is increased, energy consumption is increased.

BRIEF DESCRIPTION OF THE DRAWINGS

FIG. 1 is a plan view showing the structure of a display device DSP according to the present embodiment.

FIG. 2 is a plan view showing the main part of a first switching element SW1.

FIG. 5 is a cross-sectional view of a first substrate SUB1 taken along line C-D shown in FIG. 2.

FIG. 6 is a plan view for explaining a layout of the first switching element SW1 and a light-shielding layer BM of the present embodiment.

FIG. 7 is a cross-sectional view showing a second switching element SW2.

DETAILED DESCRIPTION

Figure 3:
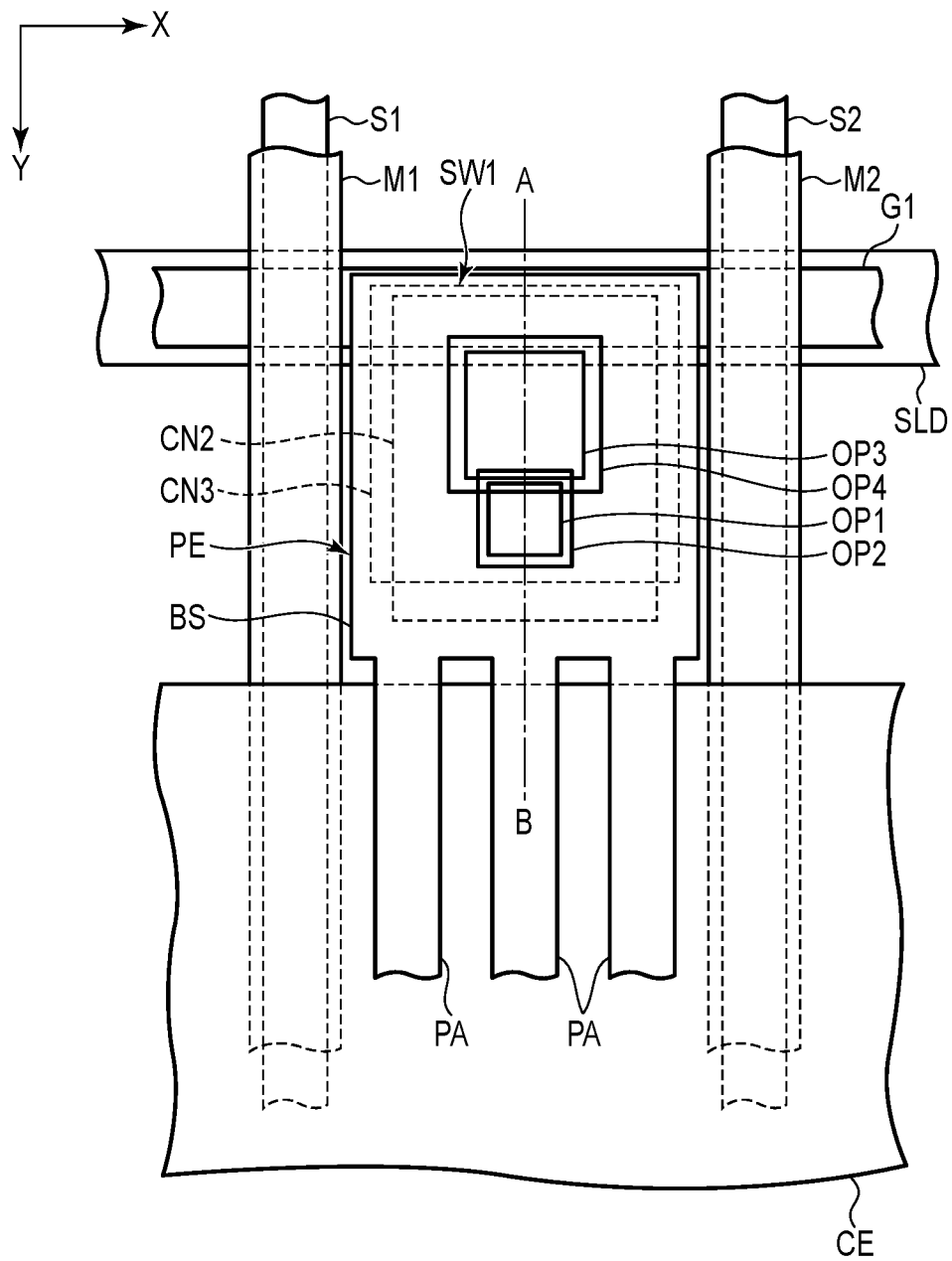
FIG. 3 is a plan view showing a pixel electrode PE connected to the first switching element SW1 shown in FIG. 2.

In general, according to one embodiment, there is provided a display device including: an oxide semiconductor layer; a protective metal layer covering a part of the oxide semiconductor layer; a first inorganic insulating film covering the oxide semiconductor layer and the protective metal layer; a gate electrode provided on the first inorganic insulating film; a second inorganic insulating film provided on the first inorganic insulating film, and covering the gate electrode; a first connection electrode in contact with the protective metal layer at a first opening portion which penetrates through the first inorganic insulating film and the second inorganic insulating film; a first organic insulating film provided on the second inorganic insulating film, and covering at least a part of the first connection electrode; a second connection electrode in contact with the first connection electrode at a second opening portion which penetrates through the first organic insulating film; a second organic insulating film provided on the first organic insulating film, and covering at least a part of the second connection electrode; a third connection electrode in contact with the second connection electrode at a third opening portion which penetrates through the second organic insulating film; a third inorganic insulating film provided on the second organic insulating film, and covering at least a part of the third connection electrode; and a pixel electrode in contact with the third connection electrode at a fourth opening portion which penetrates through the third inorganic insulating film, wherein the second opening portion is located above the first opening portion.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. Furthermore, in the present specification and drawings, structural elements which function in the same or a similar manner to those described in connection with preceding drawings are denoted by like reference numbers, and detailed explanations of them that are considered redundant may be arbitrarily omitted.

In the present embodiment, a liquid crystal display device is explained as an example of the display device. Note that the main structures disclosed in the present embodiment are applicable to display devices such as a self-luminous display device with organic electroluminescent display elements and the like, an electronic paper-type display device with electrophoretic elements and the like, a display device employing micro-electromechanical systems (MEMS), and a display device employing electrochromism.

FIG. 1 is a plan view showing the structure of a display device DSP according to the present embodiment. The display device DSP comprises a display panel PNL, and an illumination device IL. The display panel PNL comprises a first substrate SUB1, a second substrate SUB2, and a liquid crystal layer LC. The liquid crystal layer LC is an example of a display function layer, and is sealed between the first substrate SUB1 and the second substrate SUB2.

The display panel PNL includes, in an area where the first substrate SUB1 and the second substrate SUB2 overlap one another, a display area DA which displays an image, and a peripheral area SA surrounding the display area DA. The display panel PNL includes a plurality of pixels PX in the display area DA. The pixels PX are arrayed in a matrix.

The first substrate SUB1 comprises a plurality of scanning lines G and a plurality of signal lines S in the display area DA. The scanning lines G each extend in a first direction X, and are arranged in a second direction Y. The signal lines S each extend in the second direction Y, and are arranged in the first direction X. In an example shown in FIG. 1, although the scanning lines G and the signal lines S are illustrated by a straight line, the scanning lines G and the signal lines S may be bent or meandering. Also, in the peripheral area SA, the first substrate SUB1 comprises a scanning line drive circuit GD, and a signal line drive circuit SD. The scanning lines G are electrically connected to the scanning line drive circuit GD. The signal lines S are electrically connected to the signal line drive circuit SD.

The pixel PX includes a plurality of sub-pixels SP. Each of the sub-pixels SP corresponds to a region delimited by two adjacent scanning lines G and two adjacent signal lines S, for example. Note that in the present disclosure, the sub-pixel may be simply referred to as a pixel. In the example shown in FIG. 1, one pixel PX comprises three sub-pixels SP (R), SP (G), and SP (B). The sub-pixel SP (R) displays red, the sub-pixel SP (G) displays green, and the sub-pixel SP (B) displays blue. However, the pixel PX may include more number of sub-pixels SP. Also, the colors to be displayed by the sub-pixels SP are not limited to red, green, and blue, and the other colors such as white and yellow may apply.

In each of the sub-pixels SP, the first substrate SUB1 comprises a first switching element SW1, and a pixel electrode PE. The first switching element SW1 is electrically connected to the scanning line G and the signal line S. The pixel electrode PE is electrically connected to the first switching element SW1. Also, the first substrate SUB1 comprises a common electrode CE. The common electrode CE is provided in common to the plurality of sub-pixels SP. Note that the common electrode CE may be provided on the second substrate SUB2.

The first substrate SUB1 includes a terminal area TA not overlapping the second substrate SUB2. In the example shown in FIG. 1, an IC chip 1 and a flexible printed circuit 2 are mounted on the terminal area TA. Note that the IC chip 1 may be mounted on the flexible printed circuit 2. For example, the IC chip 1 is electrically connected to the common electrode CE, the scanning line drive circuit GD, and the signal line drive circuit SD. The IC chip 1 supplies a common voltage Vcom to the common electrode CE. The IC chip 1 supplies various signals to the scanning line drive circuit GD and the signal line drive circuit SD. The signal line drive circuit SD supplies a video signal to each of the signal lines S. The scanning line drive circuit GD comprises a plurality of vertical circuits 40. For example, each of the vertical circuits 40 comprises a shift register and a buffer. The vertical circuit 40 supplies a scanning signal to the scanning line G. The vertical circuit 40 comprises a second switching element SW2 to be described later. Note that the other circuit provided in the peripheral area SA such as the signal line drive circuit SD may comprise the second switching element SW2. As described above, the first substrate SUB1 comprises the first switching element SW1 provided in the display area DA, and the second switching element SW2 provided in the peripheral area SA. As will be described later, the first switching element SW1 comprises an oxide semiconductor layer, and the second switching element SW2 comprises a polycrystalline silicon semiconductor layer.

The illumination device IL is provided on a rear side of the display panel PNL, and illuminates the display area DA. The illumination device IL comprises a plate-like light guide, and a plurality of light sources that are arranged along an end surface of the light guide, though the details of the illumination device IL will not be described.

FIG. 2 is a plan view showing the main part of the first switching element SW1. The first switching element SW1 is electrically connected to a scanning line G1 and a signal line S2. The first switching element SW1 of an example illustrated in FIG. 2 has a single-gate structure. The first switching element SW1 comprises an oxide semiconductor layer SC1, a first connection electrode CN1, and a second connection electrode CN2. The oxide semiconductor layer SC1 is provided such that a part of the oxide semiconductor layer SC1 overlaps the signal line S2, and the other part extends between the signal lines S1 and S2. The oxide semiconductor layer SC1 includes a crossover portion (channel region) SCC where the oxide semiconductor layer SC1 intersects with the scanning line G1 between the signal lines S1 and S2. The crossover portion SCC corresponds to a region indicated by hatch lines in the drawing. In the scanning line G1, a region overlapping the oxide semiconductor layer SC1 (or the crossover portion SCC) serves as a gate electrode GE. The oxide semiconductor layer SC1 includes one end portion SCA covered with a protective metal layer PMA, and the other end portion SCB covered with a protective metal layer PMB. The crossover portion SCC is located between the one end portion SCA and the other end portion SCB. Note that the shape of the oxide semiconductor layer SC1 is not limited to that illustrated in FIG. 2.

The first connection electrode CN1 and the second connection electrode CN2 are each formed in an island shape between the signal lines S1 and S2. The first connection electrode CN1 is provided to overlap the protective metal layer PMA, and is in contact with the protective metal layer PMA at a first opening portion OP1. The second connection electrode CN2 is provided to overlap the first connection electrode CN1, and is in contact with the first connection electrode CN1 at a second opening portion OP2. The second connection electrode CN2 also overlaps the protective metal layer PMA.

A shield wiring line SLD extends in the first direction X along the scanning line G1. The shield wiring line SLD is provided below the scanning line G1. The shield wiring line SLD is electrically connected to the scanning line G1, though not described in detail. A width of the shield wiring line SLD in the second direction Y is greater than a width of the scanning line G1 in the second direction Y. The shield wiring line SLD overlaps the whole of the scanning line G1 in planar view. Note that the width of the shield wiring line SLD, and the width of the scanning line G1 do not need be constant as illustrated in the drawing. The shield wiring line SLD and the scanning line G1 may be partially enlarged in the second direction Y, or partially reduced in the second direction Y.

The oxide semiconductor layer SC1 is provided between the shield wiring line SLD and the scanning line G1. That is, the crossover portion SCC of the oxide semiconductor layer SC1 overlaps the shield wiring line SLD in planar view. In other words, the shield wiring line SLD has the function as a light-shielding film which blocks light directed toward the crossover portion SCC from the illumination device IL. Accordingly, it is possible to suppress current leakage of the first switching element SW1 which results from the light being irradiated upon the crossover portion SCC.

A metal line M1 extends along the signal lines S1. A metal line M2 extends along the signal lines S2. The first connection electrode CN1 described above is located in the same layer as that of the signal lines S1 and S2, and is formed of the same material as that of the signal line S1, etc. The second connection electrode CN2 described above is located in the same layer as that of the metal lines M1 and M2, and is formed of the same material as that of the metal line M1, etc.

The size of the first opening portion OP1 is smaller than the size of the second opening portion OP2. The second opening portion OP2 is formed to overlap the first opening portion OP1. The entire periphery of a first edge which defines the first opening portion OP1 is located on the inner side of a second edge which defines the second opening portion OP2 in planar view. Note that a part of the first edge may overlap the second edge. Also, although a part of the first edge may intersect with the second edge, preferably, the area of the first opening portion OP1 surrounded by the second edge should be smaller than the area of the first opening portion OP1 on the outer side of the second edge, in this case.

The light-shielding layer BM to be described later is illustrated by a one-dot chain line in FIG. 2. The light-shielding layer BM is provided such that the light-shielding layer BM overlaps the scanning line G1, the shield wiring line SLD, the signal lines S1 and S2, the metal lines M1 and M2, the first connection electrode CN1, and the second connection electrode CN2.

FIG. 3 is a plan view showing the pixel electrode PE connected to the first switching element SW1 shown in FIG. 2. In FIG. 3, the oxide semiconductor layer SC1 and the first connection electrode CN1 shown in FIG. 2 are omitted from illustration.

The first switching element SW1 further comprises a third connection electrode CN3. The third connection electrode CN3 is formed in an island shape between the signal lines S1 and S2, as is the case for the second connection electrode CN2. The third connection electrode CN3 is provided to overlap the second connection electrode CN2, and is in contact with the second connection electrode CN2 at a third opening portion OP3. The third connection electrode CN3 overlaps the first opening portion OP1 and the second opening portion OP2 in planar view.

The pixel electrode PE comprises a base portion BS, and a plurality of strip electrodes PA. The base portion BS and the strip electrodes PA are formed integrally. The base portion BS overlaps the second connection electrode CN2 and the third connection electrode CN3. Also, the base portion BS overlaps the first connection electrode CN1 shown in FIG. 2. The base portion BS is in contact with the third connection electrode CN3 at a fourth opening portion OP4. The pixel electrode PE is thereby electrically connected to the first switching element SW1. In an example illustrated in FIG. 3, although the number of strip electrodes PA is three, the number may be two or less, or four or more. The strip electrodes PA overlap the common electrode CE. The common electrode CE also overlaps the signal lines S1 and S2, and the metal lines M1 and M2. The third connection electrode CN3 is located in the same layer as that of the common electrode CE, and is formed of the same material as that of the common electrode CE.

The size of the third opening portion OP3 is smaller than the size of the fourth opening portion OP4. The fourth opening portion OP4 is formed to overlap the third opening portion OP3. The entire periphery of a third edge which defines the third opening portion OP3 is located on the inner side of a fourth edge which defines the fourth opening portion OP4 in planar view. Note that a part of the third edge may overlap the fourth edge. Also, a part of the third edge may intersect with the fourth edge. The third opening portion OP3 and the fourth opening portion OP4 are formed between the second opening portion OP2 and the scanning line G1.

Figure 4:
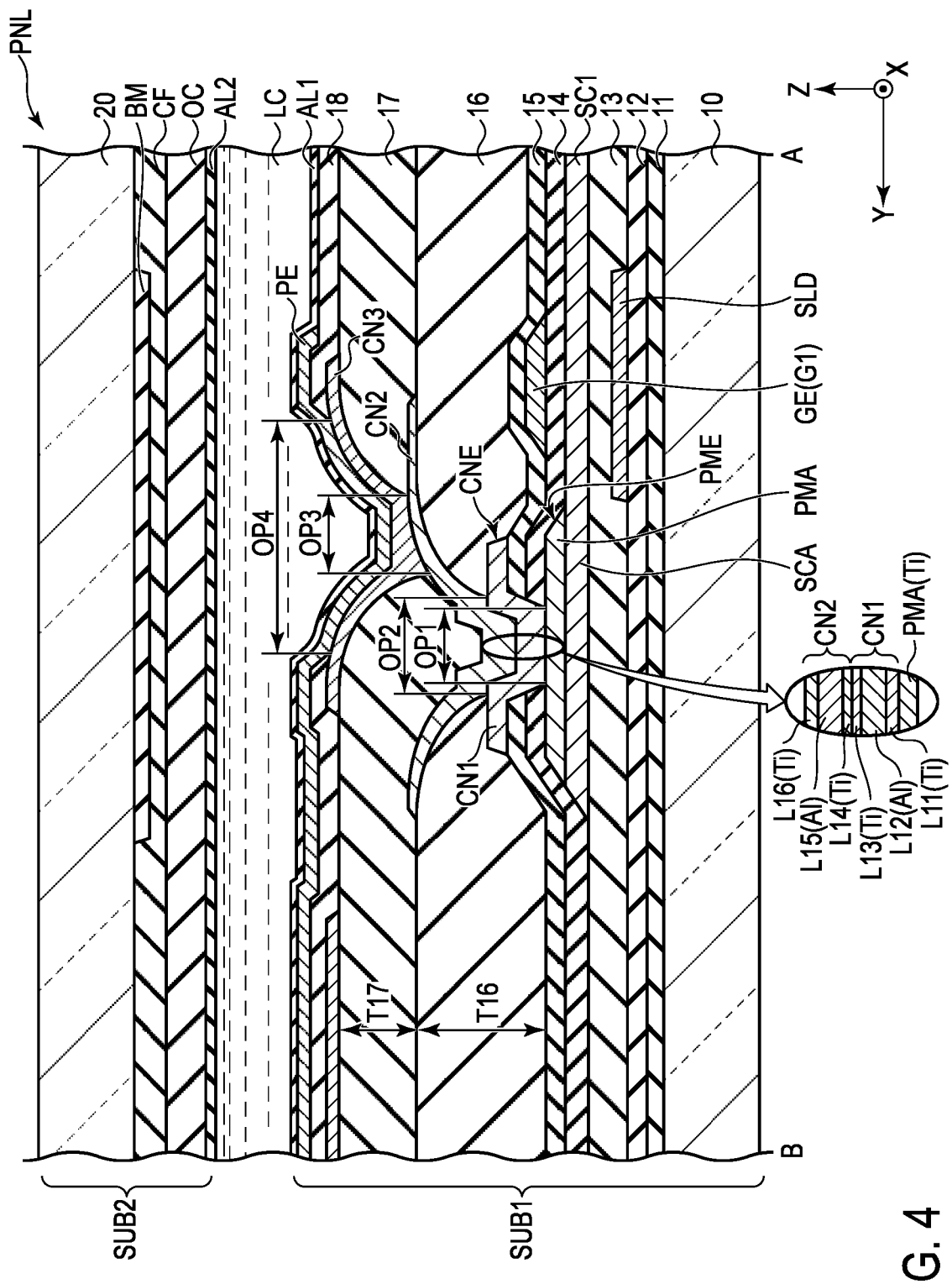
FIG. 4 is a cross-sectional view of a display panel PNL taken along line A-B shown in FIG. 3.

FIG. 4 is a cross-sectional view of the display panel PNL taken along line A-B shown in FIG. 3. The illustrated example corresponds to a case where a fringe field switching (FFS) mode, which is one of display modes that use a lateral electric field, is applied.

The first substrate SUB1 comprises an insulating substrate 10, insulating films 11 to 18, the shield wiring line SLD, the oxide semiconductor layer SC1, the protective metal layer PMA, the gate electrode GE, the first connection electrode CN1, the second connection electrode CN2, the third connection electrode CN3, the common electrode CE, the pixel electrode PE, an alignment film AL1, and the like.

The insulating film 11 is provided on the insulating substrate 10. The insulating film 12 is provided on the insulating film 11. The shield wiring line SLD is provided on the insulating film 12. The insulating film 13 is provided on the insulating film 12, and covers the shield wiring line SLD.

The oxide semiconductor layer SC1 is provided on the insulating film 13. The protective metal layer PMA covers a part of the oxide semiconductor layer SC1 (i.e., the one end portion SCA). The insulating film 14 is provided on the insulating film 13, and directly covers the protective metal layer PMA. Also, the insulating film 14 directly covers the oxide semiconductor layer SC1 exposed from the protective metal layer PMA. The gate electrode GE which is integral with the scanning line G1 is provided on the insulating film 14. The insulating film 15 is provided on the insulating film 14, and covers the gate electrode GE.

The first connection electrode CN1 is provided on the insulating film 15, and is in contact with the protective metal layer PMA at the first opening portion OP1 which penetrates through the insulating films 14 and 15. The insulating film 16 is provided on the insulating film 15, and covers the first connection electrode CN1. The second connection electrode CN2 is provided on the insulating film 16, and is in contact with the first connection electrode CN1 at the second opening portion OP2 which penetrates through the insulating film 16. The second opening portion OP2 is located directly above the first opening portion OP1.

The insulating film 17 is provided on the insulating film 16, and covers the second connection electrode CN2. The third connection electrode CN3 is provided on the insulating film 17, and is in contact with the second connection electrode CN2 at the third opening portion OP3 which penetrates through the insulating film 17. The insulating film 18 is provided on the insulating film 17, and covers the third connection electrode CN3. The pixel electrode PE is provided on the insulating film 18, and is in contact with the third connection electrode CN3 at the fourth opening portion OP4 which penetrates through the insulating film 18. The fourth opening portion OP4 is located directly above the third opening portion OP3.

The signal lines S1 and S2 not shown are provided on the insulating film 15, and the metal lines M1 and M2 are provided on the insulating film 16. The common electrode CE is provided on the insulating film 17. The insulating film 18 covers the common electrode CE. The pixel electrode PE overlaps the common electrode CE via the insulating film 18. The alignment film AL1 is provided on the insulating film 18, and covers the pixel electrode PE.

The insulating substrate 10 is a light transmissive substrate such as a glass substrate or a resin substrate having flexibility. Each of the insulating films 11 to 15, and the insulating film 18 is a transparent inorganic insulating film formed of an insulating material such as silicon oxide, silicon nitride, or silicon oxynitride, and may have a single-layer structure or a multilayer structure. Each of the insulating films 16 and 17 is a transparent organic insulating film formed of an insulating material such as acrylic resin. In the example illustrated, the insulating film 14 corresponds to a first inorganic insulating film, the insulating film 15 corresponds to a second inorganic insulating film, the insulating film 16 corresponds to a first organic insulating film, the insulating film 17 corresponds to a second organic insulating film, and the insulating film 18 corresponds to a third inorganic insulating film. The insulating film 17 is thinner than the insulating film 16. For example, directly under the common electrode CE, the insulating film 16 has a thickness T16, the insulating film 17 has a thickness T17, and the thickness T17 is less than the thickness T16.

The shield wiring line SLD, the gate electrode GE, and the scanning line G1 are formed of, for example, molybdenum-tungsten alloy. The protective metal layer PMA is formed of, for example, titanium (Ti).

The first connection electrode CN1 is a metallic electrode constituted by a first stacked layer body in which a plurality of metal layers are stacked over one another. The first stacked layer body is constituted of, for example, a first layer L11 containing titanium (Ti), a second layer L12 containing aluminum (Al), and a third layer L13 containing titanium (Ti) which are stacked in this order in a third direction Z. The signal lines S1 and S2 are also constituted by the same first stacked layer body as that of the first connection electrode CN1.

The second connection electrode CN2 is a metallic electrode constituted by a second stacked layer body in which a plurality of metal layers are stacked over one another. The second stacked layer body is constituted of, for example, a fourth layer L14 containing titanium (Ti), a fifth layer L15 containing aluminum (Al), and a sixth layer L16 containing titanium (Ti) which are stacked in this order in the third direction Z. The metal lines M1 and M2 are also constituted by the same second stacked layer body as that of the second connection electrode CN2.

Each of the third connection electrode CN3 and the common electrode CE is a transparent electrode formed of a transparent conductive material such as indium tin oxide (ITO) or indium zinc oxide (IZO). Similarly, the pixel electrode PE is a transparent electrode formed of ITO or IZO.

When the second opening portion OP2 and the third opening portion OP3 are focused, the third opening portion OP3 is located between the gate electrode GE and the second opening portion OP2 along the second direction Y. That is, the second opening portion OP2 and the third opening portion OP3 are provided to be shifted from each other in the second direction Y. As compared to a case where the second opening portion OP2, which is formed in the insulating film 16 corresponding to the first organic insulating film, and the third opening portion OP3, which is formed in the insulating film 17 corresponding to the second organic insulating film, overlap one another, it is possible to moderate a difference in level along the third direction Z.

When the second opening portion OP2 is focused, the third connection electrode CN3 extends directly above the second opening portion OP2. The insulating film 17 is provided between the second connection electrode CN2 and the third connection electrode CN3 directly above the second opening portion OP2. In other words, the insulating film 17 is provided to fill a recess formed by the first opening portion OP1 and the second opening portion OP2. Consequently, a difference in level created by the first opening portion OP1 and the second opening portion OP2 can be moderated.

In a region where the first opening portion OP1 and the second opening portion OP2 overlap one another, the protective metal layer PMA on the oxide semiconductor layer SC1, the first connection electrode CN1, the second connection electrode CN2, and the insulating film 17 are stacked in this order along the third direction Z.

When the third opening portion OP3 is focused, the insulating film 16 is provided directly under the third opening portion OP3. Also, the insulating film 16 is in contact with the insulating film 15 directly under the third opening portion OP3.

The protective metal layer PMA includes an end portion PME which is closer to the gate electrode GE than the first connection electrode CN1 is along the second direction Y. An end portion CNE of the first connection electrode CN1 is located directly above the protective metal layer PMA. Between the end portion PME and the third opening portion OP3, the insulating film 14, the insulating film 15, the insulating film 16, and the second connection electrode CN2 are stacked in this order along the third direction Z. In the third opening portion OP3, the second connection electrode CN2 on the insulating film 16, the third connection electrode CN3, and the pixel electrode PE are stacked in this order along the third direction Z.

As shown in FIG. 4 in an enlarged scale, the first connection electrode CN1 and the second connection electrode CN2 are stacked along the third direction Z directly above the protective metal layer PMA. The protective metal layer PMA, the first connection electrode CN1, and the second connection electrode CN2 include metal layers containing a metal material of a same group. In other words, in the example described above, the protective metal layer PMA is formed of titanium, the first connection electrode CN1 includes the first layer L11 and the third layer L13 containing titanium, and the second connection electrode CN2 includes the fourth layer L14 and the sixth layer L16 containing titanium. At an interface between the protective metal layer PMA and the first connection electrode CN1, the protective metal layer PMA and the first layer L11 are in contact with each other. At an interface between the first connection electrode CN1 and the second connection electrode CN2, the third layer L13 and the fourth layer L14 are in contact with each other.

The second substrate SUB2 comprises an insulating substrate 20, the light-shielding layer BM, a color filter layer CF, an overcoat layer OC, an alignment film AL2, and the like.

The insulating substrate 20 is a light transmissive substrate such as a glass substrate or a resin substrate, as is the case for the insulating substrate 10. The light-shielding layer BM and the color filter layer CF are provided between the insulating substrate 20 and the first substrate SUB1. The light-shielding layer BM is provided to overlap the scanning line G1 including the gate electrode GE, the oxide semiconductor layer SC1, the protective metal layer PMA, the first connection electrode CN1, the second connection electrode CN2, and the third connection electrode CN3 in the third direction Z. Meanwhile, the light-shielding layer BM is not provided in a region where the common electrode CE and the pixel electrode PE overlap one another.

The overcoat layer OC covers the color filter layer CF. The alignment film AL2 covers the overcoat layer OC. The alignment film AL1 and the alignment film AL2 are formed of, for example, a material exhibiting horizontal alignment properties.

The liquid crystal layer LC is located between the first substrate SUB1 and the second substrate SUB2, and is provided between the alignment film AL1 and the alignment film AL2.

While the illumination device IL shown in FIG. 1 is provided below the insulating substrate 10, the illumination device IL is omitted from the illustration. Also, in an ordinary transmissive liquid crystal display device, while a polarizer is bonded to each of the insulating substrates 10 and 20, illustration thereof is omitted.

FIG. 5 is a cross-sectional view of the first substrate SUB1 taken along line C-D shown in FIG. 2. As described above, the other end portion SCB of the oxide semiconductor layer SC1 is covered with the protective metal layer PMB. The signal line S2 is provided on the insulating film 15, and is in contact with the protective metal layer PMB at an opening portion OP11 which penetrates through the insulating films 14 and 15. The signal line S2 is thereby electrically connected to the first switching element SW1. The insulating film 16 covers the signal line S2.

The metal line M2 is provided on the insulating film 16. The insulating film 17 is provided on the insulating film 16, and covers the metal line M2. The common electrode CE is provided on the insulating film 17, and is in contact with the metal line M2 at an opening portion OP12 which penetrates through the insulating film 17. The common electrode CE is thereby electrically connected to the metal line M2.

FIG. 6 is a plan view for explaining a layout of the first switching element SW1 and the light-shielding layer BM of the present embodiment. In FIG. 6, the main part of the first switching element SW1 of the present embodiment is indicated on the right side, and the main part of a first switching element SW1 of a comparative example is indicated on the left side. When the present embodiment and the comparative example are compared, the positions of the first opening portion OP1 and the second opening portion OP2 are different. That is, in the present embodiment, while the second opening portion OP2 overlaps the first opening portion OP1 as described above, in the comparative example, the second opening portion OP2 is located between a scanning line G1 and the first opening portion OP1.

The first connection electrode CN1 is in contact with the protective metal layer PMA at the first opening portion OP1, and is in contact with the second connection electrode CN2 at the second opening portion OP2. Accordingly, the first connection electrode CN1 extends to overlap both of the first opening portion OP1 and the second opening portion OP2. For this reason, in the comparative example in which the first opening portion OP1 and the second opening portion OP2 are aligned in the second direction Y, a first connection electrode CN1 is enlarged in the second direction Y as compared to the first connection electrode CN1 of the present embodiment. In other words, according to the present embodiment, since the second opening portion OP2 overlaps the first opening portion OP1, the width of the first connection electrode CN1 along the second direction Y is reduced.

In a configuration example in which the light-shielding layer BM is provided to cover the whole of the first connection electrode CN1, as the width of the first connection electrode CN1 along the second direction Y is reduced, as in the present embodiment, the width of the light-shielding layer BM along the second direction Y can also be reduced. Therefore, in comparing the present embodiment with the comparative example, the present embodiment enables the opening portion which contributes to display per pixel to be increased, as compared to the comparative example. Consequently, when the levels of brightness of illumination devices necessary for equalizing the brightness per pixel are compared in the present embodiment and the comparative example, as compared to the comparative example, the present embodiment enables the brightness of the illumination device to be suppressed, which means that an increase in energy consumption can be suppressed.

In addition, according to the present embodiment, as has been described with reference to FIG. 4, the third opening portion OP3 is located between the gate electrode GE and the second opening portion OP2, the insulating film 17 is provided directly above the second opening portion OP2, and the insulating film 16 is provided directly under the third opening portion OP3. Consequently, a difference in level due to the first to fourth opening portions OP1 to OP4 is moderated. Therefore, it is possible to suppress alignment failure of liquid crystal molecules due to the first to fourth opening portions OP1 to OP4. Moreover, since alignment failure directly above the second opening portion OP2 is suppressed, even if a distance between an end portion of the light-shielding layer BM and the second opening portion OP2 is reduced along the second direction Y, it is possible to suppress light leakage caused by the alignment failure, and also reduction of the contrast ratio caused by the light leakage.

FIG. 7 is a cross-sectional view showing the second switching element SW2. The second switching element SW2 comprises a semiconductor layer SC2, a gate electrode GE2, a source electrode SE2, and a drain electrode DE2. The semiconductor layer SC2 is formed of polycrystalline silicon. The semiconductor layer SC2 is located on the insulating film 11, and is covered with the insulating film 12. The gate electrode GE2 is located on the insulating film 12, and is covered with the insulating film 13. The gate electrode GE2 is located in the same layer as that of the shield wiring line SLD shown in FIG. 4, and is formed of the same material as that of the shield wiring line SLD.

Each of the source electrode SE2 and the drain electrode DE2 is located on the insulating film 15, and is covered with the insulating film 16. The source electrode SE2 is in contact with the semiconductor layer SC2 at an opening portion OP21 which penetrates through the insulating films 12 to 15. The drain electrode DE2 is in contact with the semiconductor layer SC2 at an opening portion OP22 which penetrates through the insulating films 12 to 15. The source electrode SE2 and the drain electrode DE2 are located in the same layer as that of the first connection electrode CN1 shown in FIG. 4, and are formed of the same material as that of the first connection electrode CN1.

The insulating films 16 to 18, and the alignment film AL1 are provided directly above the second switching element SW2 as described above.

The first opening portion OP1 shown in FIG. 4, the opening portion OP1*l* shown in FIG. 5, and the opening portions OP2*l* and OP22 shown in FIG. 7 can be formed by, for example, the same etching process. In order to reduce contact resistance between the semiconductor layer SC2 formed of polycrystalline silicon and the source electrode SE2 and the drain electrode DE2, before these electrodes are formed, it is necessary to clean the surface of the semiconductor layer SC2 exposed from the opening portions OP2*l* and OP22 by a hydrofluoric acid aqueous solution. In performing the cleaning, the interior of the first opening portion OP1 and the opening portion OP11 is also exposed to the hydrofluoric acid aqueous solution. Although the oxide semiconductor layer SC1 can be eroded by the hydrofluoric acid aqueous solution, in the present embodiment, the protective metal layers PMA and PMB are provided on the surface of the oxide semiconductor layer SC1. Accordingly, the oxide semiconductor layer SC1 can be protected from the hydrofluoric acid aqueous solution.

As described above, according to the present embodiment, a display device capable of suppressing an increase in energy consumption can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   an oxide semiconductor layer;
   a protective metal layer covering a part of the oxide semiconductor layer;
   a first inorganic insulating film covering the oxide semiconductor layer and the protective metal layer;
   a gate electrode provided on the first inorganic insulating film;
   a second inorganic insulating film provided on the first inorganic insulating film, and covering the gate electrode;
   a first connection electrode in contact with the protective metal layer at a first opening portion which penetrates through the first inorganic insulating film and the second inorganic insulating film;
   a first organic insulating film provided on the second inorganic insulating film, and covering at least a part of the first connection electrode;
   a second connection electrode in contact with the first connection electrode at a second opening portion which penetrates through the first organic insulating film;
   a second organic insulating film provided on the first organic insulating film, and covering at least a part of the second connection electrode;
   a third connection electrode in contact with the second connection electrode at a third opening portion which penetrates through the second organic insulating film;
   a third inorganic insulating film provided on the second organic insulating film, and covering at least a part of the third connection electrode; and
   a pixel electrode in contact with the third connection electrode at a fourth opening portion which penetrates through the third inorganic insulating film,
   wherein the second opening portion is located above the first opening portion.

2. The display device of claim 1, wherein an entire periphery of a first edge which defines the first opening portion is located on an inner side of a second edge which defines the second opening portion in planar view.

3. The display device of claim 1, wherein the second organic insulating film is thinner than the first organic insulating film.

4. The display device of claim 1, wherein:
   the first connection electrode is constituted by a first stacked layer body in which a plurality of metal layers are stacked over one another;
   the second connection electrode is constituted by a second stacked layer body in which a plurality of metal layers are stacked over one another; and
   the third connection electrode is formed of a transparent conductive material.

5. The display device of claim 1, wherein the third opening portion is located between the gate electrode and the second opening portion.

6. The display device of claim 5, wherein:
   the third connection electrode is provided over the second opening portion; and
   the second organic insulating film is provided between the second connection electrode and the third connection electrode above the second opening portion.

7. The display device of claim 5, wherein the first organic insulating film is provided below the third opening portion.

8. The display device of claim 7, wherein the first organic insulating film is in contact with the second inorganic insulating film below the third opening portion.

9. The display device of claim 1, wherein the protective metal layer includes an end portion which is closer to the gate electrode than the first connection electrode is.

10. The display device of claim 1, wherein:
    the first connection electrode and the second connection electrode are stacked on the protective metal layer;
    the protective metal layer, the first connection electrode, and the second connection electrode include metal layers containing a metal material of a same group; and
    the metal layers containing the metal material of the same group are in contact with each other at an interface between the protective metal layer and the first connection electrode, and an interface between the first connection electrode and the second connection electrode.

11. The display device of claim 1, wherein an entire periphery of a third edge which defines the third opening portion is located on an inner side of a fourth edge which defines the fourth opening portion in planar view.

12. The display device of claim 1, wherein:
    the protective metal layer, the first connection electrode, and the second connection electrode form a stacked layer body by being stacked in order;
    the stacked layer body comprises first to third metal layers containing a first metal material, and fourth and fifth metal layers containing a second metal material different from the first metal material;
    the fourth metal layer is located between the first metal layer and the second metal layer; and
    the fifth metal layer is located between the second metal layer and the third metal layer.

13. The display device of claim 1, further comprising:
    a signal line which is electrically connected to the oxide semiconductor layer at a fifth opening portion which penetrates through the first inorganic insulating film and the second inorganic insulating film, and is covered with the first organic insulating film;
    a metal line provided on the first organic insulating film; and
    a common electrode which is provided on the second organic insulating film, and is in contact with the metal line at a sixth opening portion which penetrates through the second organic insulating film, wherein
    the sixth opening portion is located above the fifth opening portion.

14. The display device of claim 13, further comprising a metal layer interposed between the oxide semiconductor layer and the signal line.

15. The display device of claim 14, wherein:
    the metal layer is formed of a same material as a material of the protective metal layer;

the signal line is formed of a same material as a material of the first connection electrode;
the metal line is formed of a same material as a material of the second connection electrode; and
the common electrode is formed of a same material as a material of the third connection electrode.

* * * * *